(12) United States Patent
Osawa

(10) Patent No.: US 6,850,367 B2
(45) Date of Patent: Feb. 1, 2005

(54) LIGHT EXPOSURE APPARATUS AND LIGHT EMITTING DEVICE THEREFOR

(75) Inventor: Osamu Osawa, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/395,210

(22) Filed: Mar. 25, 2003

(65) Prior Publication Data

US 2003/0179458 A1 Sep. 25, 2003

(30) Foreign Application Priority Data

Mar. 25, 2002 (JP) ........................................ 2002-084394

(51) Int. Cl.[7] .................... G02B 27/10; G02B 27/30; G03B 27/42; G03B 27/52; G03B 27/54
(52) U.S. Cl. ...................... 359/619; 359/626; 359/641; 355/53; 355/55; 355/67; 355/69
(58) Field of Search .................. 359/619, 620, 359/621, 622, 626, 641; 355/53, 55, 67, 69, 71

(56) References Cited

U.S. PATENT DOCUMENTS

| | | | |
|---|---|---|---|
| 5,194,893 A | * | 3/1993 | Nishi ........................... 355/53 |
| 5,710,620 A | * | 1/1998 | Taniguchi ..................... 355/53 |
| 5,760,963 A | | 6/1998 | Mori |
| 6,252,647 B1 | * | 6/2001 | Shiraishi ....................... 355/53 |
| 6,404,482 B1 | * | 6/2002 | Shiraishi ....................... 355/53 |
| 6,549,266 B1 | * | 4/2003 | Taniguchi ..................... 355/53 |
| 6,573,977 B1 | * | 6/2003 | Mori ............................. 355/69 |
| 6,710,855 B2 | * | 3/2004 | Shiraishi ....................... 355/67 |

FOREIGN PATENT DOCUMENTS

| | | |
|---|---|---|
| JP | 8-195338 A1 | 7/1996 |
| JP | 8-262367 A1 | 10/1996 |
| JP | 2001-33875 A1 | 2/2001 |
| JP | 2002-237442 A1 | 8/2002 |

* cited by examiner

Primary Examiner—Loha Ben
(74) Attorney, Agent, or Firm—Rader, Fishman & Grauer PLLC

(57) ABSTRACT

A light emitting device according to the present invention comprises a light source, a condensing mirror for condensing light from the light source, a light intensity controlling unit for controlling light intensity of the condensed light, a collimator lens provided from the light intensity controlling unit at a focal distance of the collimator lens, and an integrator lens, wherein light emitted from the collimator lens is overlaid on an entire incident surface of the integrator lens.

4 Claims, 6 Drawing Sheets

FIG. 5A
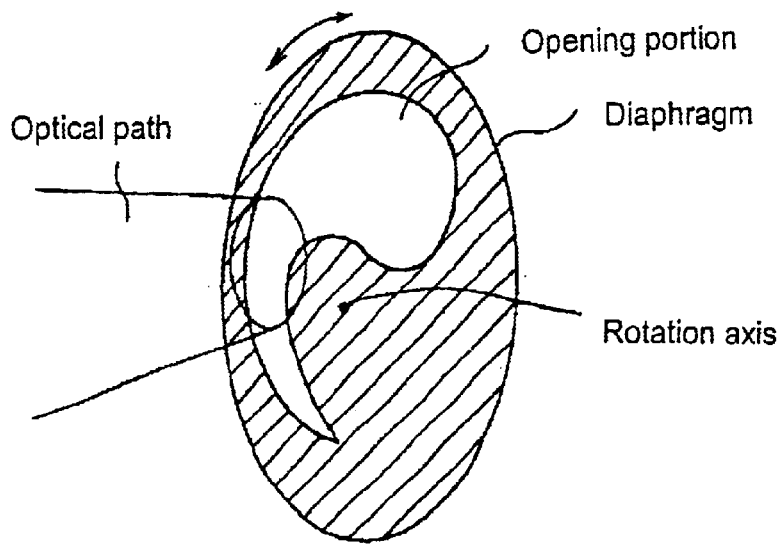
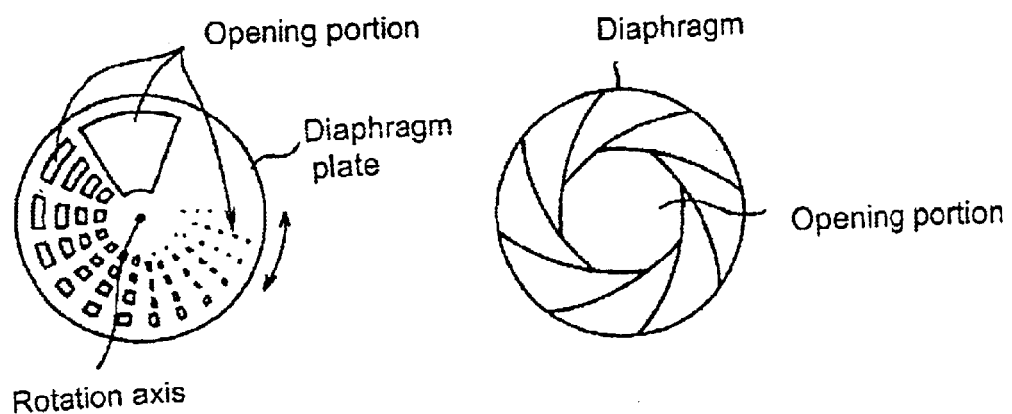
FIG. 5B
FIG. 5C

LIGHT EXPOSURE APPARATUS AND LIGHT EMITTING DEVICE THEREFOR

TECHNICAL FIELD OF THE INVENTION

This invention relates to a light emitting device, especially a light emitting device, which is, used as a light source of a light exposure apparatus etc. for manufacturing integrated circuits or liquid crystal display devices.

DESCRIPTION OF RELATED ART

FIG. 3 shows a schematic diagram of a conventional light emitting device 1 which is used as a light source of light exposing device.

As shown in FIG. 3, the light emitting device 1 comprises a lamp 2 as a light source, a condensing mirror 3 for condensing light emitted from the lamp 2 (the light source), a first reflecting mirror 4 for changing a direction of the emitted light, a filter 5 for attenuating the intensity of the light reflected from the first reflecting mirror 4, a collimator lens 6 that forms parallel light from the light emitted from the center of the opening of the condensing mirror 3, an integrator lens (a fly-eye lens) 7 that receives the incident light which is not uniform but has symmetrical illumination distribution with respect to the optical axis and emits uniform light, a second reflecting mirror 8 for changing a direction of the incident light, and a collimator lens 9 that forms the incident light into parallel light and emits the parallel light.

The light emitted from the lamp 2 (light source) is condensed by the condensing mirror 3, and then reflected by the first reflecting mirror 4. The reflected light enters the collimator lens 6 after passing through the filter 5 and then converted to parallel light by the collimator lens 6. The integrator lens 7 receives the parallel light.

Light is defined as Parallel light when a center ray of light entering each of lenses of the integrator lens 7 is parallel, that is, a ray of light from the center portion of the opening of the condensing mirror 3, is parallel.

The light emitted from the integrator lens 7 is reflected by the second reflector 8. The collimator lens 9 forms parallel light from the reflected light and the parallel light is emitted outside the light emitting device 1. Thereby, an exposure area 11 is exposed with a uniform illumination distribution by the parallel light.

The collimator lens 9 may be replaced with a collimator mirror.

When a mask 10 is placed on the exposure area 11, a mask pattern formed on the mask 10 is projected onto a substrate 13 via a projection lens 12 and the substrate 13 is exposed.

Without using the projection lens 12, the light emitting device 1 may be applied to an exposure apparatus for exposing a substrate 13 to form a mask pattern by attaching the mask 10 to the substrate 13 or placing the mask 10 close to the substrate 13.

Instead of the mask 10, it is possible to place a work piece to be exposed on the exposure area 11 and to treat the surface of the work piece by photochemical reactions.

For example, it is possible to execute light-polarization treatment of a light polarization film of a liquid crystal display device.

FIG. 4 is a schematic diagram for explaining the function of the integrator lens 7 shown in FIG. 3.

As shown in the figure, the integrator lens 7 comprises over 10 to several dozen lenses, which are arranged in vertical and horizontal directions.

Each of these lenses 71–73 receives divided incident light, and the divided lights from the lenses are overlaid on the exposure area 11 of the substrate surface 11. As a result, the illumination distribution on the exposure area is made uniform.

The illumination distribution of the light received by the integrator lens 7 is not uniform, that is, the intensity of the light is low around a peripheral portion of the exposure area 11 and high at the center portion of the exposure area 11 near the optical axis as shown in the figure. However, the illumination distribution of the light is symmetric with respect to the optical axis.

However, a first lens 71 of the integrator lens 7 that receives light having the illumination distribution A, emits light having the illumination distribution A' on the exposure area 11, a second lens 72 and a third lens 73 that receive light having illumination distributions B and C respectively emit light having the illumination distributions B' and C' on the exposure area 11. As a result, on the exposure area 11, the lights from the lenses 71 to 13 are overlaid, thereby, light having uniform illumination distribution A'+B'+C' is obtained on the exposure area 11.

On the other hand, depending on the nature of the exposed object, it is necessary for the light emitting device 11 to control the illuminance on the exposure area 11 by reducing light exposure. In such a case, as shown in FIG. 3, for example, the filter 5 comprising vacuum-plating filter etc. for controlling the amount of transmitted light is inserted on the incident side of the integrator lens 7.

SUMMARY OF THE INVENTION

In recent years, it is desired to maintain a fixed luminance on an exposure area of a substrate surface even though emitting luminance falls by degradation with the passage of time. Further, depending on the nature of the exposed object, it is required to finely control the luminance or sequentially change the luminance in a state where luminance falls largely. In such a case, the variable range of the luminance may be 10 to 100%.

Even though the intensity of the light from the lamp 2 is attenuated to, for example, half or one third by using the filter 5 comprising the deposited filter as described above, it is impossible to maintain a fixed luminance on the exposure area 11 of the substrate 13 at all times or to continuously change the luminance of the light in a state where the luminance falls.

Since the transparency of the filter 5 must be increased as the illumination of the light falls, a plurality of filters having different permeability rates (transparency) are required, which causes cost rise and is not realistic.

Further, in a method in which a plurality of filters are replaced, it is impossible to continuously change the luminance of the light, therefore, it is difficult to finely adjust the luminance on the exposure area 11 of the substrate 13.

Instead of using such filters 5, it is possible to use a filter capable of varying the luminance without a break.

FIGS. 5A, 5B and 5C show an example of a diaphragm plate capable of varying luminance without a break respectively.

FIGS. 5A and 5B show a rotatable diaphragm plate capable varying an opening area without a break. The diaphragm plate is placed in the optical path. The amount of light passing through the opening can be varied without a break by rotating the plate with respect to the rotation axis.

FIG. 5C shows a diaphragm plate capable of varying the diameter of the opening without a break, as used in a camera.

All the diaphragm plates described above, are capable of varying the intensity of passing light by blocking part of luminous flux. Especially, the diaphragm plates shown in FIGS. 5A and 5B, are manufactured by machining without increasing cost.

However, where such a diaphragm capable of varying the diameter of the opening as shown in FIGS. 5A to 5C is applied to the light emitting device 1 of the exposing device as shown in FIG. 3, there is a problem described below. That is, where such a diaphragm capable of varying the diameter of the opening as shown in FIGS. 5A to 5C instead of using the filter 5 is used in the light emitting device 1, the illumination distribution on the exposure area 11 deteriorates as described below.

In the case that the diaphragm shown in FIG. 5A or 5B is used, the opening rate (that is, a rate between a blocking area and an opening area) differs depending on area used, and the luminance of incident light is not symmetric with respect to the optical axis. That is, the transmission rate of the luminous flex differs depending on a position in the exposure area 11, as shown in FIG. 6, the illumination distribution A, B and C of the incident light entering into the integrator lens 7 (illumination distribution on the incident surface of the integrator lens 7) becomes out of shape. Therefore, on the exposure area 11, the illumination distribution of the overlaid lights, A'+B'+C' is not uniform.

In case that the diaphragm shown in FIG. 5C is used, although the illumination distribution of incident light entering into the integrator lens 7 does not get out of shape, shade of a light blocking portion is projected on the integrator lens 7, thereby, as the opening the diaphragm is small, only an center area of the integrator lens 7 receives the incident light and the number of lenses comprising the integrator lens 7 that receive the incident light decreases.

Since the number of the lenses comprising the integrator 7 is selected to obtain a desired illumination distribution on the exposure area 11, when the number of lenses comprising the integrator lens 7 decreases, the illumination distribution deteriorates, while the illumination distribution becomes uniform when the number of the lenses comprising the integrator lens 7 increases.

As such, the uniformity effects of illumination distribution became decreased when the number of the lenses used is decreased, thereby, the illumination distribution deteriorates.

Although it is possible to provide such a diaphragm plate on the light output side of the integrator lens 7, since the diaphragm plate partially blocks the light made to have uniform illumination distribution by the effects of the integrator lens 7, the illumination distribution deteriorates.

In view of foregoing, it is an object of the present invention to provide a light emitting device capable of obtaining uniform illumination distribution on an exposure area even though light from a light source is asymmetric with respect to the optical axis.

It is another object of the present invention to provide a light emitting device capable of varying illumination distribution without a break maintaining uniformity of the illumination distribution on an exposure area.

According to the present invention, a light emitting device comprises a light source, a condensing mirror for condensing light from the light source at a focal point, a light intensity controlling unit, provided around the focal point, for controlling light intensity of the condensed light a collimator lens provided at a focal distance of the collimator lens from the light intensity controlling unit, and an integrator lens provided so that light from the collimator lens is overlaid on an entire incident surface of the integrator lens.

Accordingly, even though light passing through the light intensity controlling unit is asymmetric with respect to the optical axis of luminous flux, it is possible for the entire incident surface area of the integrator lens to receive light having illumination distribution which is symmetric with respect to the optical axis. As a result, it is possible to obtain uniform illumination distribution on the exposure area.

The light intensity controlling unit may have an opening whose opening rate succinctly changes.

Therefore, even though an inexpensive diaphragm is used, it is possible for the entire incident surface area of the integrator lens to receive light having illumination distribution which is symmetric with respect to optical axis and further, it is possible to change luminance on the exposure area without a break and to obtain a desired luminance on the exposure area.

Further the light intensity controlling unit may be a diaphragm.

The light emitting device may further include a diaphragm driving mechanism.

The light emitting device may further include an illuminometer to measure luminance of light and a controlling unit to control the opening rate of the diaphragm.

According to the present invention, a light exposure apparatus comprises a light emitting device having a light source, a condensing mirror for condensing light from the light source at a focal point, a light intensity controlling unit, provided around the focal point, for controlling light intensity of the condensed light, a collimator lens provided at a focal distance of the collimator lens from the light intensity controlling unit, and an integrator lens provided so that light from the collimator lens is overlaid on an entire incident surface of the integrator lens.

DESCRIPTION OF THE DRAWINGS

The present inventions will now be described by way of example with reference to the following figures in which:

FIG. 5A shows a front elevational view of a diaphragm plate capable of varying luminance without break;

FIG. 5B shows a front elevational view of another diaphragm plate capable of varying luminance without break;

FIG. 5C shows a front elevational view of still another diaphragm plate capable of varying luminance without break.

DETAILED DESCRIPTION OF THE INVENTION

An embodiment of the present invention is described based on FIGS. 1 and 2 below.

Figure 1:
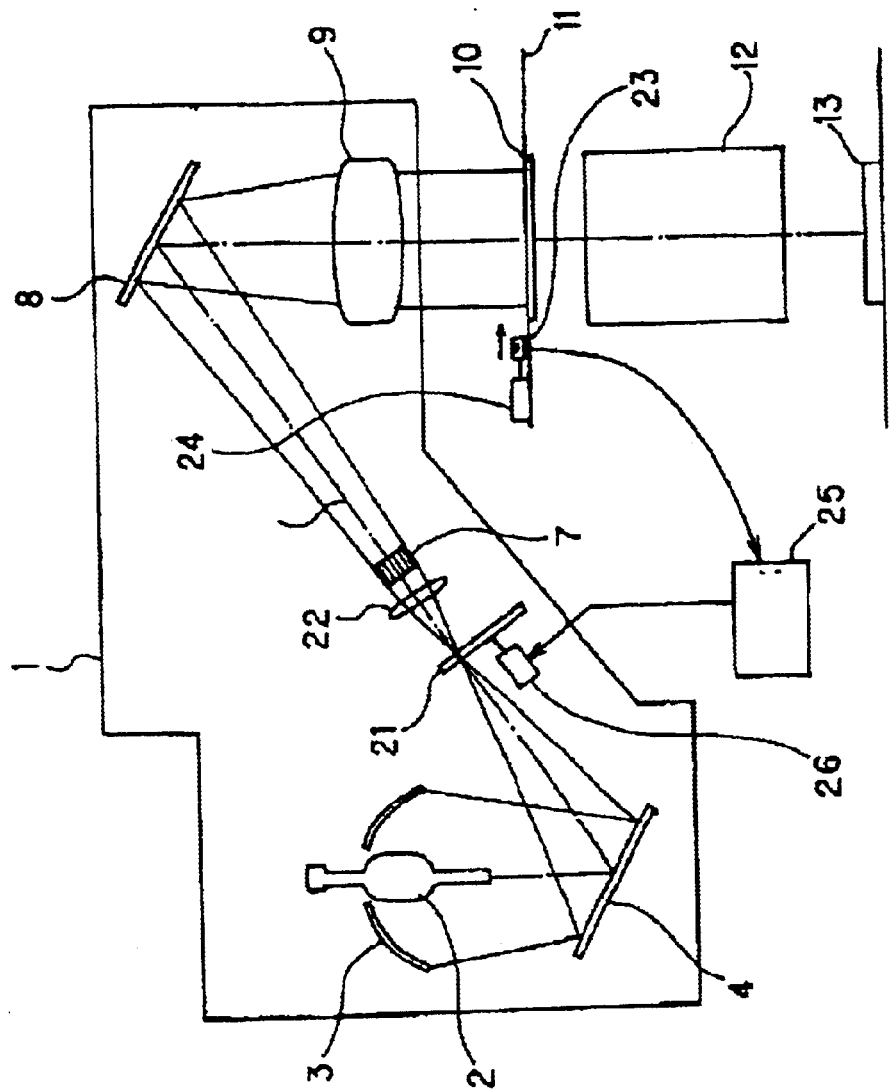
FIG. 1 is a schematic diagram of a light emitting device used as a light source of an exposure apparatus according to the present invention.

FIG. 1 is a schematic diagram of a light emitting device 1 used as a light source of an exposing device according to the present invention.

A light intensity controlling unit 21 such as a diaphragm, is provided at or around the second focus point F2 of the condensing mirror 3 where light emitted from a light source of a lamp 2 provided at or around the first focal point F1 of the condensing mirror 3 is condensed the most.

A collimator lens 22 is provided at a focal distance Dc of the collimator lens 22 away from the light intensity controlling unit 21 (diaphragm). The collimator lens 29 forms light passing through the light intensity controlling unit 21 into parallel light and the parallel light is received by the integrator lens 7.

An illuminometer 23 for measuring luminance on an exposure area 11 is provided near the exposure area 11. An illuminometer driving mechanism 24 changes a position of the illuminometer 23. A controlling unit 25 receives a measuring signal (signals) measured by the illuminometer 23 and outputs a driving signal (or signals) for driving a diaphragm driving mechanism 26. The diaphragm driving mechanism 26 drives the diaphragm 21 to change light intensity passing through the diaphragm 21 according to the driving signal. An operator may manually move the diaphragm 21 from outside of the light emitting device 1, looking at the illuminometer 23.

Figure 3:
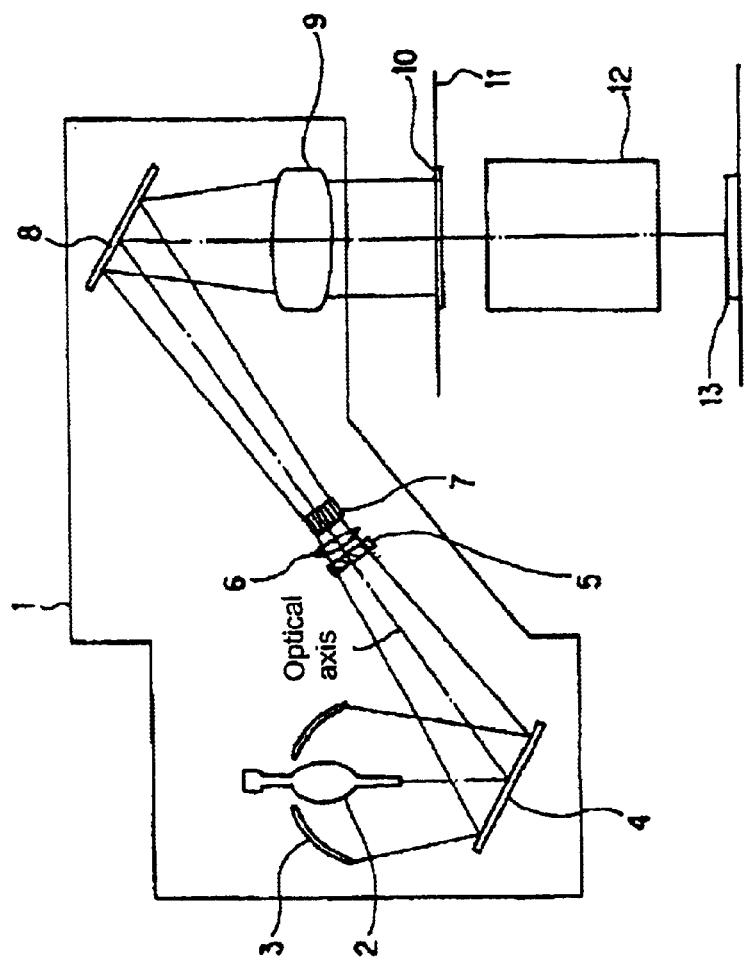
FIG. 3 is a diagram showing a light emitting device used as a light source a conventional exposing device.
Figure 4:
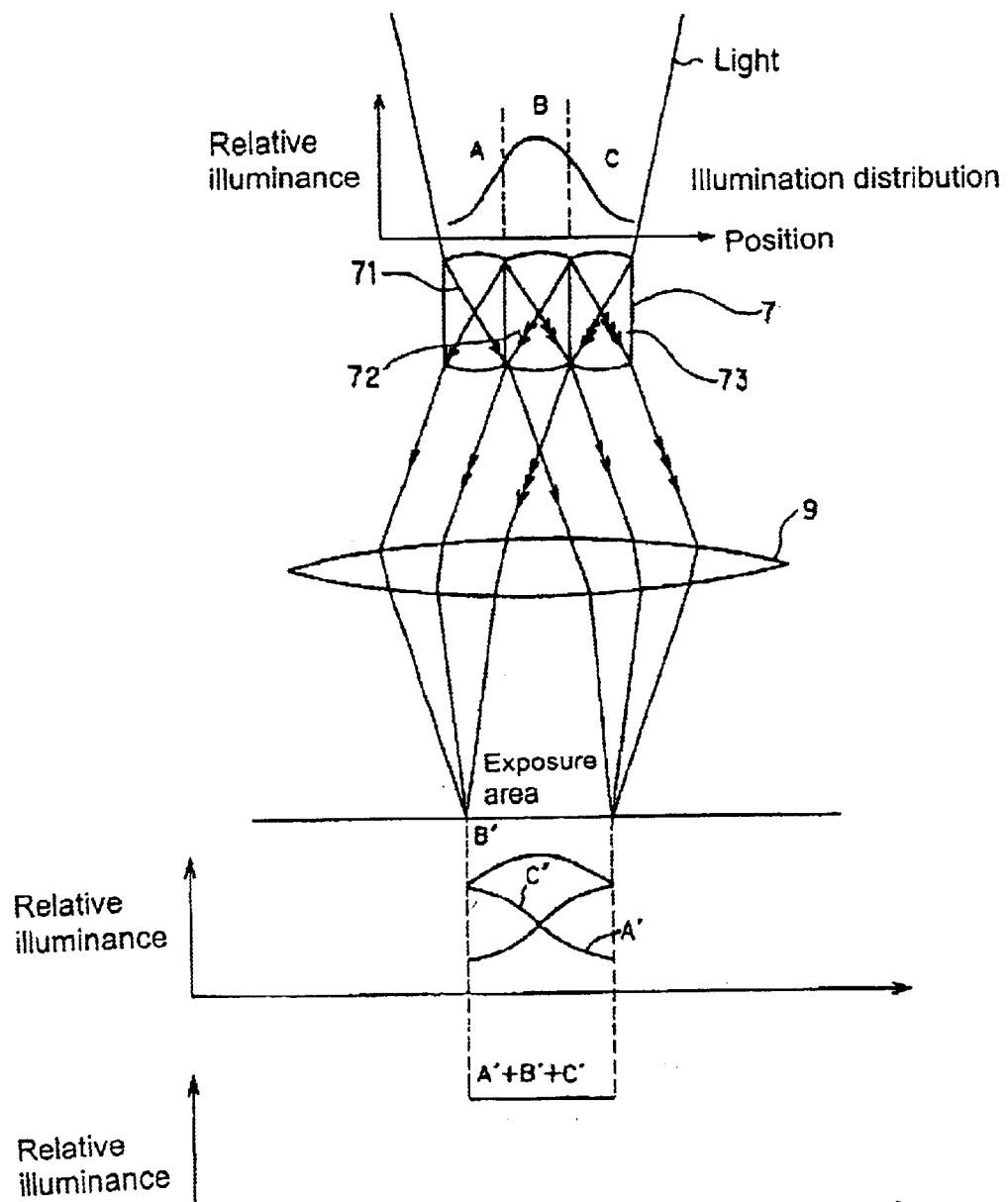
FIG. 4 is a diagram explaining a function of an integrator lens shown in FIG. 3.
Figure 6:
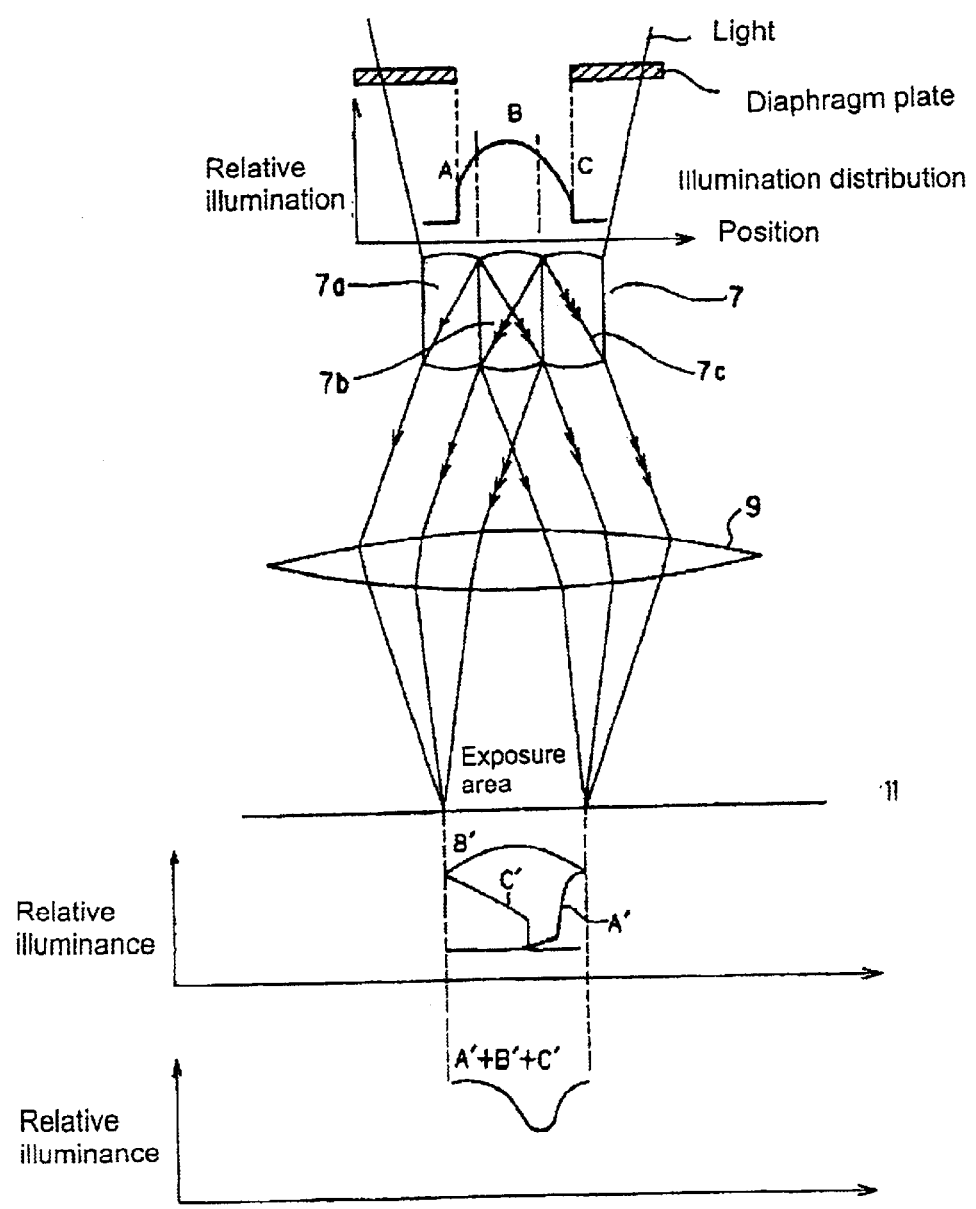
FIG. 6 is a diagram explaining the function of the integrator lens in case that the diaphragm plate shown in FIGS. 5A, 5B or 5C is used in the light emitting device shown in FIG. 3.

Since other elements of the light emitting device 1 are the same as those shown in FIG. 3 and are denoted as the same number respectively, description thereof is omitted.

In the conventional light emitting device 1 shown in FIG. 3, the incident surface of the integrator lens 7 is located at the second focal point of the condensing mirror 3 and the filter 5 is located on the upstream side of the second focal point. On the other hand, the light emitting device 1 according to the present invention, as described above, the diaphragm 21 is provided at or around the second focal point F2 of the condensing mirror 3 where the light is condensed most, that is, in a predetermined area including the second focal point F2, and the collimator lens 22 is located at the focal distance Dc of the collimator lens 22 from the diaphragm 21. Accordingly, since the light emitting device 1 has such a structure, parallel lights emitted from the collimator lens 22 are overlaid on and enter the integrator lens 7.

Next, in the light emitting device 1 according to the present invention, it is described below referring to FIG. 2 why it is possible to make the illumination distribution of the light, emitted on the exposure area 11 from the integrator lens 7, uniform by placing the diaphragm 21 and the collimator lens 22 in such position described above.

Figure 2:
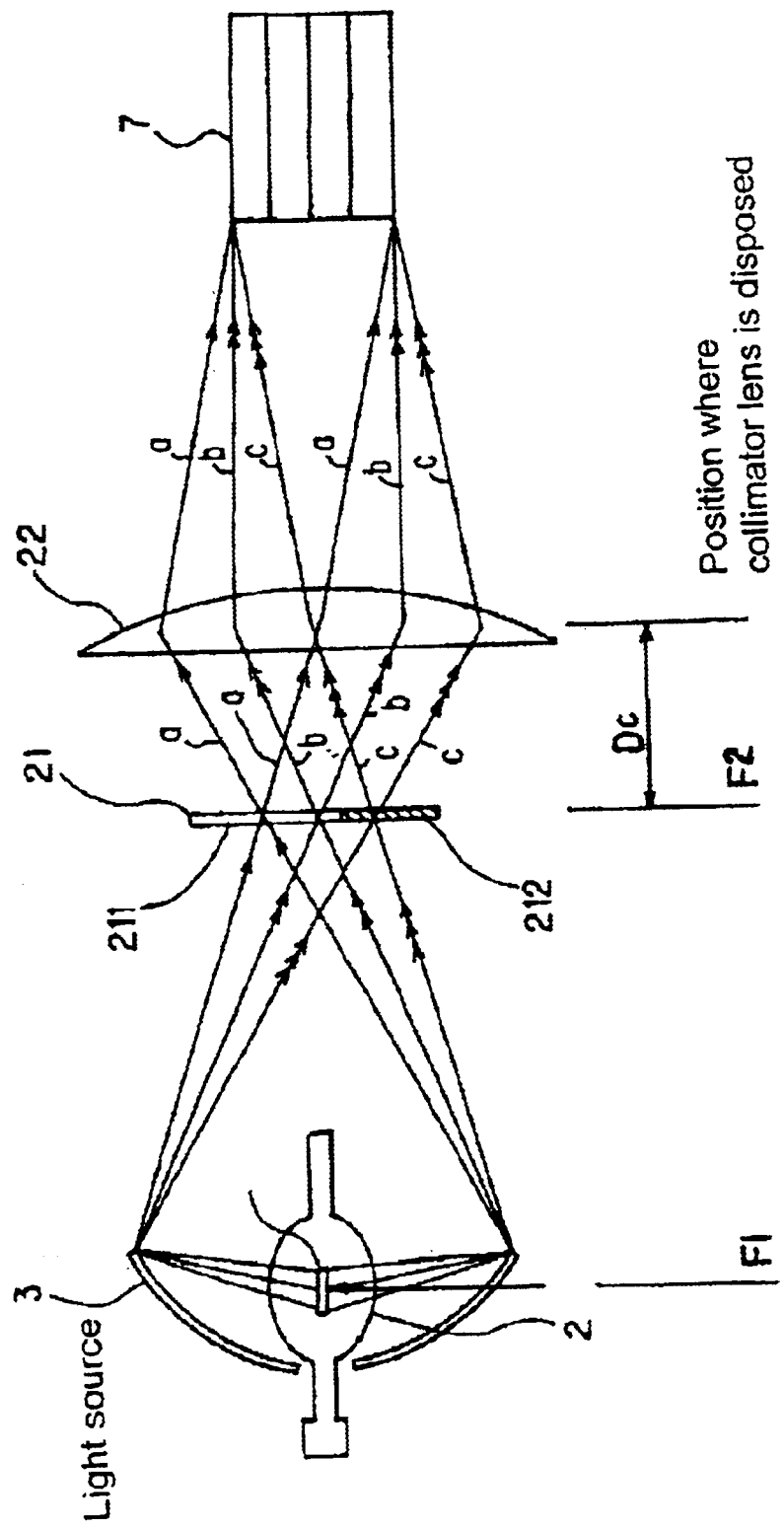
FIG. 2 is a diagram showing the enlarged relevant part of the light emitting device.

FIG. 2 is a diagram showing the enlarged relevant part of the light emitting device 1.

As shown in FIG. 2, the light emitted from the light source of the lamp 2 provided at or around the focal point F1 of the condensing mirror 3 is reflected by the condensing mirror 3, and condensed on the diaphragm 21 provided at or around the second focal point F2 of the condensing mirror 3.

The light condensed on the diaphragm 21 becomes scattering light again and enters the collimator lens 22. Further, the light entering the, collimator lens 22 is output as parallel light and enters the integrator lens 7.

The light entering the diaphragm 21 is output from the collimator lens 22 as parallel light without regard to the incident position on the diaphragm 21 as shown in FIG. 2. The parallel light output from the collimator lens 22 is emitted onto the entire surface of the integrator lens 7.

For example, light a—a or light b—b passing through the opening 211 of the diaphragm 21 uniformly enters the entire area of the incident surface of the integrator lens 7 as parallel light a—a or parallel light b—b by the collimator lens 22. In case that light is blocked by a light blocking portion 212 of the diaphragm 21, the blocked light c—c is uniformly blocked on the entire incident area of the integrator lens 7 by the collimator lens 7. That is, even though the diaphragm 21 having the light blocking portion 212 (the opening portion 211) that is asymmetric with respect to the optical axis is used, despite the asymmetric light blocking portion 212 (the opening portion 211), the light from the diaphragm 21 is symmetric with respect to the optical axis on the incident surface of the integrator lens 7.

As the diaphragm 21 having the opening portion 211 and the blocking portion 212, for example, a conventional diaphragm as shown in FIGS. 5A, 5B or 5C can be used.

In FIG. 1, for example, the diaphragm 21 shown in FIG. 5A or 5B is used and the illuminometer 23 is disposed on the exposure area 11.

The controlling unit 25 compares a value measured by the illuminometer 23 to a predetermined luminance value. The controlling unit 21 adjusts the diaphragm 21 by sending a driving signal (signals) to the diaphragm driving mechanism 26 so as to open the diaphragm 21 when the measured value is less than the predetermined luminance value and so as to close the diaphragm 21 when the measured value is larger than the predetermined luminance value. As a result, on the exposure area 11, uniform illumination distribution is obtained and it is possible to maintain a fixed luminance. Therefore, despite degradation with the passage of time, it is possible to emit light having a fixed luminance on the exposure area 11.

Instead of maintaining a fixed luminance on the exposure area 11 using the illuminometer 23, it is possible to obtain desired luminance having uniform illumination distribution without a break on the exposure area by rotating the diaphragm 21 by driving the diaphragm driving mechanism 26.

Thus, a light emitting device according to the present invention comprises a light source, a condensing mirror for condensing light from the light source, a light intensity controlling unit for controlling light intensity of the condensed light, a collimator lens provided from the light intensity controlling unit at a focal distance of the collimator lens, and an integrator lens, wherein light emitted from the collimator lens is overlaid on an entire incident surface of the integrator lens. Accordingly, even though light passing through the light intensity controlling unit 21 is asymmetric with respect to the optical axis of luminous flux, it is possible for the entire incident surface area of the integrator lens 7 to receive light having illumination distribution which is symmetric with respect to the optical axis. As a result, it is possible to obtain uniform illumination distribution on an exposure area.

Further, when the light intensity controlling unit is a diaphragm having an opening whose opening rate succinctly changes, even though an inexpensive diaphragm is used, it is possible for the entire incident surface area of the integrator lens to receive light having illumination distribution which is symmetric with respect to optical axis and further, it is possible to change luminance on the exposure area without a break and to obtain a desired luminance on the exposure area.

The disclosure of Japanese Patent Application No. 2002-084394 filed on Mar. 25, 2002 including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A light emitting device comprising:

a light source;

a condensing mirror for condensing light from the light source at a focal point;

a light intensity controlling unit, provided around the focal point, for controlling light intensity of the condensed light, a collimator lens provided at a focal distance of the collimator lens from the light intensity controlling unit; and an integrator lens provided so that light from the collimator lens is overlaid on an entire incident surface of the integrator lens, wherein the light intensity controlling unit has an opening whose opening rate succinctly changes.

2. A light emitting device comprising:

a light source;

a condensing mirror for condensing light from the light source at a focal point;

a light intensity controlling unit, provided around the focal point, for controlling light intensity of the condensed light, a collimator lens provided at a focal distance of the collimator lens from the light intensity controlling unit; and an integrator lens provided so that light from the collimator lens is overlaid on an entire incident surface of the integrator lens, wherein the light intensity controlling unit is a diaphragm.

3. The light emitting device according to claim 2, further including a diaphragm driving mechanism.

4. The light emitting device according to claim 3, further including an illuminometer to measure luminance of light and a controlling unit to control the opening rate of the diaphragm.

* * * * *